(12) United States Patent
Chung et al.

(10) Patent No.: US 8,557,044 B2
(45) Date of Patent: Oct. 15, 2013

(54) SHADOW MASK, METHOD OF MANUFACTURING THE SAME AND METHOD OF FORMING THIN FILM USING THE SAME

(75) Inventors: Seok-whan Chung, Yongin-si (KR); Seok-jin Kang, Yongin-si (KR); Hyun-koo Jeong, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1172 days.

(21) Appl. No.: 11/730,120

(22) Filed: Mar. 29, 2007

(65) Prior Publication Data
US 2008/0088221 A1 Apr. 17, 2008

(30) Foreign Application Priority Data
Oct. 17, 2006 (KR) .................. 10-2006-0101041

(51) Int. Cl.
- C23C 16/50 (2006.01)
- C23C 16/00 (2006.01)
- C23F 1/00 (2006.01)
- H01L 21/306 (2006.01)

(52) U.S. Cl.
USPC ...... 118/721; 118/715; 118/720; 156/345.19; 156/345.3

(58) Field of Classification Search
USPC ............................ 118/720; 156/345.19, 345.3
See application file for complete search history.

(56) References Cited

U.S. PATENT DOCUMENTS

| | | | | |
|---|---|---|---|---|
| 5,728,492 A | * | 3/1998 | Kawata | 430/5 |
| 6,316,289 B1 | * | 11/2001 | Chung | 438/118 |
| 6,930,021 B2 | * | 8/2005 | Yotsuya | 438/455 |
| 2002/0042158 A1 | | 4/2002 | Kersch et al. | |
| 2004/0048484 A1 | * | 3/2004 | Karpman et al. | 438/710 |

FOREIGN PATENT DOCUMENTS

| | | |
|---|---|---|
| JP | 57-076842 | 5/1982 |
| JP | 8-250448 | 9/1996 |
| JP | 2003-273129 | 9/2003 |

OTHER PUBLICATIONS

Communication dated May 11, 2012 issued by the Korean Intellectual Property Office in corresponding Korean Application No. 10-2006-0101041.

* cited by examiner

Primary Examiner — Maureen Gramaglia
Assistant Examiner — Tiffany Nuckols
(74) Attorney, Agent, or Firm — Sughrue Mion, PLLC

(57) ABSTRACT

A shadow mask, a method of manufacturing the shadow mask, and a method of forming a thin film using the shadow mask are provided. The shadow mask includes an upper layer and a lower layer. The upper layer includes a first opening. The lower layer is formed on a lower surface of the upper layer around the first opening and includes an opening having the same size as the first opening. When the thin film is formed using the shadow mask, the lower layer of the shadow mask is close to the edge of a cavity of a substrate, and a position on which the thin film may be formed as defined by the lower layer of the shadow mask. Therefore, the thickness of the thin film can be uniform.

14 Claims, 3 Drawing Sheets

SHADOW MASK, METHOD OF MANUFACTURING THE SAME AND METHOD OF FORMING THIN FILM USING THE SAME

CROSS-REFERENCE TO RELATED PATENT APPLICATIONS

This application claims priority from Korean Patent Application No. 10-2006-0101041, filed on Oct. 17, 2006, in the Korean Intellectual Property Office, the disclosure of which is incorporated herein in its entirety by reference.

BACKGROUND OF THE INVENTION

1. Field of the Invention

Apparatuses and methods consistent with the present invention relate to a shadow mask, a method of manufacturing the shadow mask and, a method of forming a thin film using the shadow mask, and more particularly, to a shadow mask including a concave-convex portion, a method of manufacturing the shadow mask, and a method of forming a thin film using the shadow mask.

2. Description of the Related Art

Recently, micro-electro mechanical system (MEMS) devices manufactured by micro-machining technology have been used in various technical applications such as display devices, laser printers, precision measurement devices, and precision processing devices. For example, a MEMS optical scanner for deflecting and reflecting scanning light is used in a display device.

Generally, the MEMS optical scanner includes a reflecting film formed on a bottom surface of a recess (a cavity) of a substrate. The width of the reflecting film is narrower than that of the cavity and a comb type driving electrode is placed at an edge of the cavity.

FIG. 1 is a cross-sectional view illustrating a related art method of forming a reflecting film of a MEMS optical scanner.

Referring to FIG. 1, a substrate SUB is prepared. A cavity (H) is formed in a surface of the substrate SUB. The bottom of the cavity (H) is flat. A shadow mask 100 is placed on the substrate SUB. The shadow mask is used for forming a thin film in the cavity (H). The shadow mask 100 includes a first opening 1 and a plurality of second openings 2, wherein the first opening 1 defines a reflecting film region in which a reflecting film will be formed, and the second openings 2 define alignment mark regions. A bottom center surface of the cavity (H) is exposed by the first opening 1. Side portions of the substrate SUB located beside the cavity (H) are exposed by the second openings 2. The shadow mask 100 is in contact with the entire surface of the substrate SUB except for the bottom surface of the cavity (H).

Then, a thin film 150 is deposited on the exposed portions of the substrate SUB by physical vapor deposition (PVD). A portion of the thin film 150 formed on the bottom center surface of the cavity (H) is a reflecting film 150a used as a mirror. The other portions of the thin film 150 formed away from the cavity (H) are used as alignment marks 150b for examining interlayer alignment states. The thin film 150 is formed by alternately depositing a $Ta_2O_3$ layer and an $SiO_2$ layer on an Ag layer.

Though not shown, the thin film 150 is also deposited on an upper surface and a sidewall of the shadow mask 100.

After the shadow mask 100 is removed from the substrate SUB, well-known processes are sequentially performed.

In the related art method of forming the reflecting film of the MEMS optical scanner, it is difficult to control the thickness of the edge of the reflecting film 150a. The reason for this is that the gap between the bottom surface of the cavity (H) and the shadow mask 100 is very large (for example, hundreds of micrometers), and thus it is difficult to precisely define the reflecting film region in the cavity (H) of the substrate SUB using the first opening 1. When the first opening 1 cannot precisely define the reflecting film region, thin film forming particles may spread away from the reflecting film region defined by the first opening 1. Therefore, the thickness of the edge of the reflecting film 150a may vary a large amount, making it difficult to control the reflectivity of the reflecting film 150 and deteriorating the reliability of the MEMS optical scanner.

SUMMARY OF THE INVENTION

Exemplary embodiments of the present invention provide a shadow mask for forming a thin film having a uniform thickness on the bottom of a cavity of a substrate.

The present invention also provides a method of manufacturing the shadow mask.

The present invention further provides a method of forming the thin film using the shadow mask.

According to an aspect of the present invention, there is provided a shadow mask including: an upper layer including a first opening; and a lower layer formed on a lower surface of the upper layer around the first opening and including an opening having the same size as the first opening.

The shadow mask may further include a middle layer interposed between the upper layer and the lower layer.

The upper layer and the lower layer may be silicon layers, and the middle layer may be a silicon oxide layer.

The upper layer may further include at least one second opening spaced apart from the first opening and the lower layer.

According to another aspect of the present invention, there is provided a method of manufacturing a shadow mask, the method including: preparing a stacked substrate in which a lower layer, a middle layer, and an upper layer are sequentially stacked; forming a first opening in the upper layer so as to expose the middle layer; etching the lower layer to remove a region of the lower layer corresponding to the first opening and to make an outer periphery of the lower layer smaller than an outer periphery of the upper layer; and removing a portion of the middle layer exposed when the upper layer and the lower layer are etched.

The lower layer and upper layer may be silicon layers, and the middle layer may be a silicon oxide layer.

The stacked substrate may be a silicon on insulator (SOI) substrate.

The forming of the first opening in the upper layer may include forming at least one second opening, and the etching of the lower layer may be performed such that the outer periphery of the etched lower layer is located between the first opening and the second opening.

According to a still further aspect of the present invention, there is provided a method of forming a thin film, the method including: preparing a substrate having a cavity; aligning the shadow mask with the substrate so as to contact the lower layer of the shadow mask to a side wall of the cavity; forming a thin film on a portion of the substrate exposed by the first opening of the shadow mask; and removing the shadow mask.

The lower layer may have a thickness smaller than a depth of the cavity by 1 to 10 μm.

The shadow mask may include a second opening in the upper layer, and the thin film may be also formed on a portion of the substrate exposed by the second opening.

BRIEF DESCRIPTION OF THE DRAWINGS

The above and other features and advantages of the present invention will become more apparent by describing in detail exemplary embodiments thereof with reference to the attached drawings, in which.

DETAILED DESCRIPTION OF EXEMPLARY EMBODIMENTS OF THE INVENTION

Figure 1:
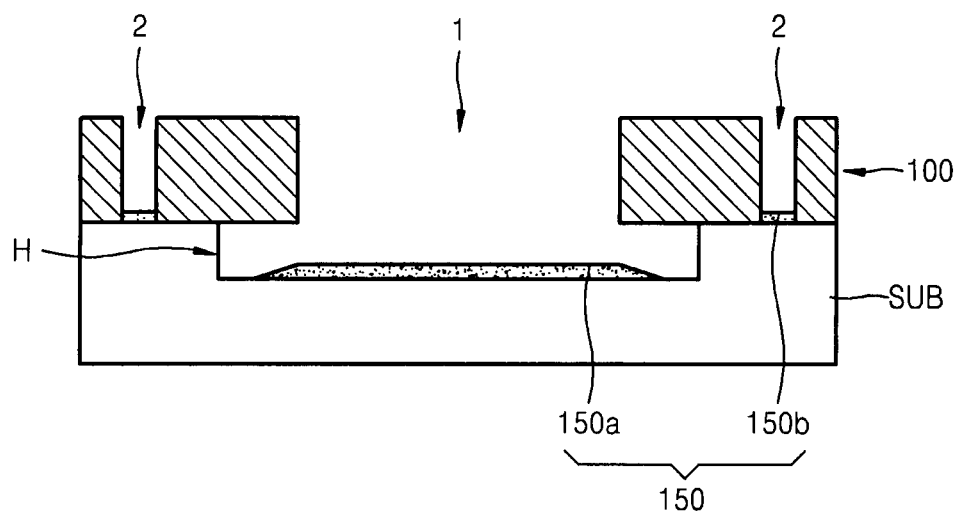
FIG. 1 is a cross-sectional view illustrating a method of forming a reflecting film of a MEMS optical scanner.

The present invention will now be described more fully with reference to the accompanying drawings according to exemplary embodiments of the present invention. In the drawings, the thicknesses of layers and regions are exaggerated for clarity.

Figure 2:
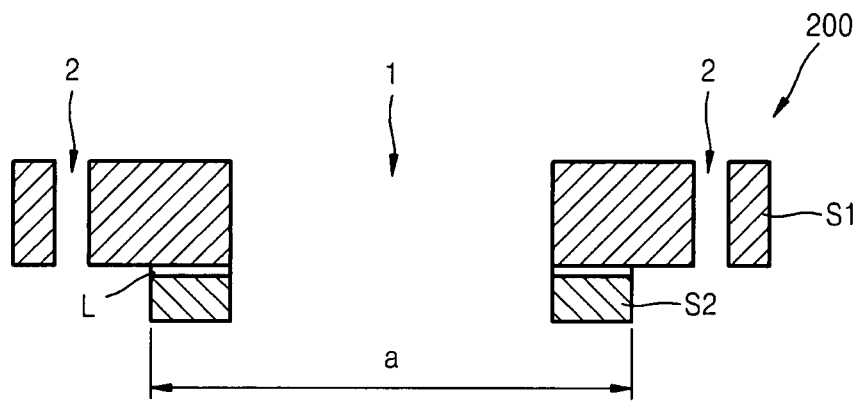
FIG. 2 is a cross-sectional view illustrating a shadow mask according to an exemplary embodiment of the present invention.

FIG. 2 is a cross-sectional view illustrating a shadow mask 200 according to an exemplary embodiment of the present invention.

Referring to FIG. 2, the shadow mask 200 includes an upper layer S1 having a first opening 1 and second openings 2. A lower layer S2 is formed on a lower surface of the upper layer S1 around the first opening 1. The lower layer S2 is a downward protruding portion of the shadow mask 200 and is designed to be inserted into a cavity of a substrate, such as, for example, cavity (H) in substrate SUB of FIG. 1. For this, an outer width (a) of the lower layer S2 is smaller than the width of the cavity of the substrate. A middle layer (L) may be interposed between the upper layer S1 and the lower layer S2. The upper and lower layers S1 and S2 may be silicon layers. The middle layer (L) may be a silicon oxide layer. The first and the second openings 1 and 2 may have various shapes such as a circle, a rectangle, and a square.

Figure 3:
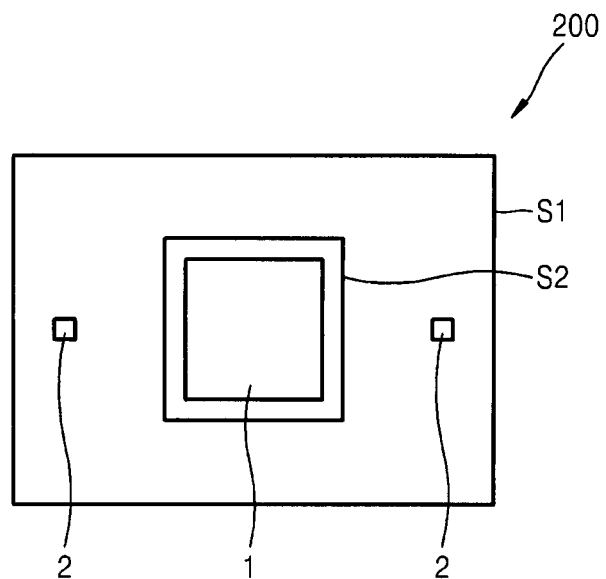
FIG. 3 is a bottom plan view illustrating a shadow mask according to an exemplary embodiment of the present invention.

FIG. 3 is a bottom plan view illustrating a shadow mask 200 according to an exemplary embodiment of the present invention.

In FIGS. 2 and 3, like reference numerals denote like elements. In FIG. 3, each of the first opening 1, the second openings 2, and the lower layer S2 has a quadrangled shape. However, the first opening 1, the second openings 2, and the lower layer S2 can have various shapes and are not limited to the shapes shown in FIG. 3.

A method of manufacturing the shadow mask 200 of FIG. 2 will now be described with reference to FIGS. 4A through 4C.

Figure 4A:
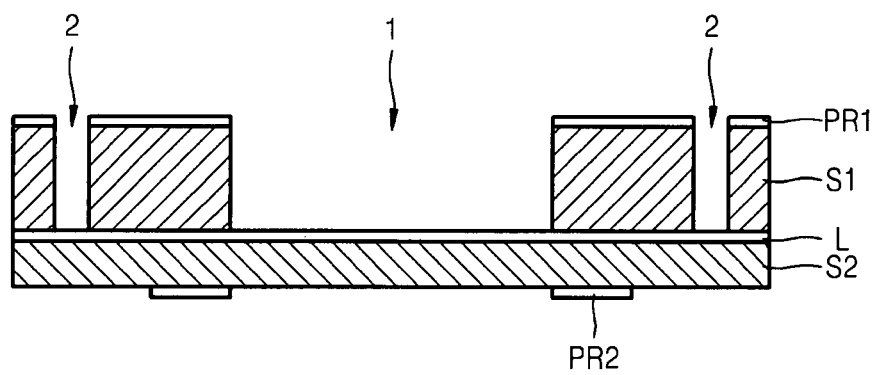
FIGS. 4A through 4C are cross-sectional views illustrating a method of manufacturing a shadow mask stage by stage according to an exemplary embodiment of the present invention.
Figure 4B:
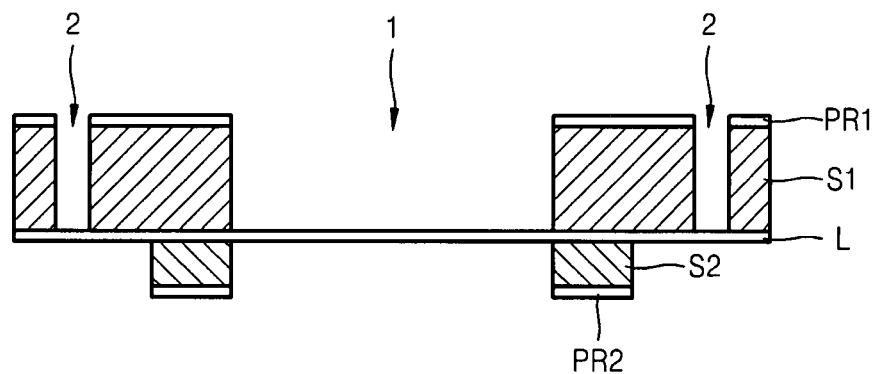
Figure 4C:
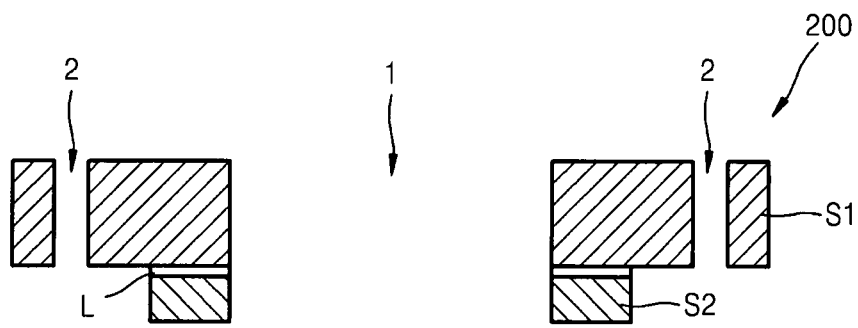

Referring to FIG. 4A, a stacked substrate is prepared. In the stacked substrate, a lower layer S2, a middle layer (L), and an upper layer S1 are sequentially stacked. The upper and lower layers S1 and S2 may be silicon layers. The middle layer (L) may be a silicon oxide layer. That is, the stacked substrate may be a silicon-on-insulator (SOI) substrate in which a lower silicon layer, a silicon oxide layer, and an upper silicon layer are sequentially stacked. A first photoresist pattern PR1 for exposing a predetermined region of the upper layer S1 is formed on the upper layer S1. Next, the predetermined region of the upper layer S1 is etched to form a first opening 1 and second openings 2 in the upper layer S1 using the first photoresist pattern PR1 as an etch mask. The first and second openings 1 and 2 expose the middle layer (L). The first and second opening 1 and 2 may have various shapes such as a circle, a rectangle, and a square. A second photoresist pattern PR2 for exposing a predetermined region of the lower layer S2 is formed on a lower surface of the lower layer S2. The second photoresist pattern PR2 covers a portion of the lower layer S2 around the first opening 1. Next, the lower layer S2 is etched using the second photoresist pattern PR2 as an etch mask. As a result, referring to FIG. 4B, the lower layer S2 is removed except for the portion of the lower layer S2 covered with the second photoresist pattern PR2. The remaining lower layer S2 is located under the upper layer S1 around the first opening 1. The inner periphery of the remaining lower layer S2 after the etching is equal to that of the first opening 1.

To etch the upper and lower layers S1 and S2, reactive ion etching (RIE) (e.g., inductively coupled plasma deep RIE (ICPDRIE)) may be used. The middle layer (L) may be used as an etch stop layer for etching the upper and the lower layers S1 and S2.

After that, the first and the second photoresist patterns PR1 and PR2 are removed. The first photoresist patterns PR1 can be removed before the etching the lower layer S2. After the first and the second photoresist patterns PR1 and PR2 are removed, portions in the middle layer (L) which are exposed by the upper and lower layers S1 and S2 are removed. Referring to FIG. 4C, in this way, the shadow mask 200 is formed according to the exemplary embodiment of the present invention.

A method of forming a thin film using a shadow mask will now be described according to an exemplary embodiment of the present invention.

Figure 5:
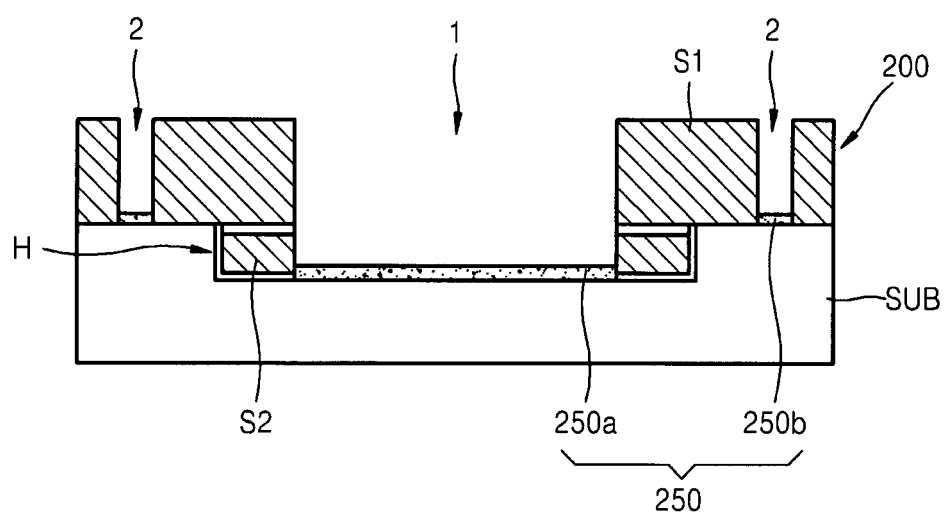
FIG. 5 is a cross-sectional view illustrating a method of forming a thin film using a shadow mask according to an exemplary embodiment of the present invention.

FIG. 5 is a cross-sectional view illustrating a method of forming a thin film using a shadow mask according to an exemplary embodiment of the present invention. In FIG. 5, a portion of a thin film 250 may be a reflecting film of a MEMS optical scanner.

Referring to FIG. 5, a substrate SUB having a cavity (H) is prepared. The cavity (H) has a predetermined width and depth. The width of the cavity (H) may be equal to several millimeters, and the depth of the cavity (H) may be equal to several hundreds of micrometers. A bottom surface of the cavity (H) may be flat. The cavity (H) may have various shapes such as a circle, a rectangle, and a square. A shadow mask 200 similar to that illustrated in FIG. 2 is placed on the substrate (SUB). A lower layer S2 of the shadow mask 200 is aligned with both side edges of the cavity (H). For this, the shadow mask 200 (especially, the thickness and the width of the lower layer S2) is designed in consideration of the thickness and depth of the cavity (H). For example, the thickness of the lower layer S2 may be smaller than the depth of the cavity (H) by 1μ to 10 μm, and an outer width (a) (refer to FIG. 2) of the lower layer S2 may be smaller than the width of the cavity (H) by 1 μm to 10 μm.

Next, a thin film 250 is formed on the substrate SUB which is exposed by the first and the second openings 1 and 2 of the shadow mask 200. A portion of the thin film 250 formed on a bottom center region of the cavity (H) may be a reflecting film 250a used as a mirror in a MEMS optical scanner, and the other portions of the thin film 250 formed on side regions of the substrate (SUB) exposed by the second openings 2 may be used as alignment marks 250b. The second openings 2 are spaced away from the cavity (H).

As described above, since the shadow mask 200 is fitted into the cavity (H) in precise alignment with the edge of the cavity (H), a thin film region for the thin film 250 can be precisely defined on the cavity (H) by the shadow mask 200. Therefore, the width of the thin film 250 can be easily adjusted, and the thickness of the thin film 250 can be more uniform.

Meanwhile, although not shown, when the thin film 250 is deposited of a predetermined material, particles of the material are deposited on an upper surface and side surfaces of the shadow mask 200.

After the thin film 250 is formed, the shadow mask 200 is removed. Since the lower layer S2 is not in tight contact with the surface of the cavity (H), the shadow mask 200 can be easily removed.

The above-described exemplary embodiments describe a shadow mask used for forming a reflecting film of a MEMS optical scanner. However, the shadow mask of the present invention can be used in other fields. That is, the shadow mask consistent with the present invention can be applied to any field for forming a thin film in a confined region such as a cavity of a substrate.

Further, although the shadow mask 200 has the first and second openings 1 and 2 in the above-described exemplary embodiments of the present invention, the shadow mask 200 of the present invention is not limited to the illustrated configuration. For example, if the alignment marks are not required, the shadow mask 200 may not have the second openings 2. That is, the thin film 250 can be formed using the shadow mask 200 having only the first opening 1.

As described above, according to the present invention, the shadow mask has a concave-convex portion, so that the shadow mask can be in close proximity to the edge of a recessed portion (a cavity) of the substrate. Therefore, the shadow mask can precisely define a thin film region on the substrate, and thus a uniform thin film can be formed in the thin film region.

Therefore, when the shadow mask consistent with the present invention is used for forming a reflecting film of a MEMS device, the reflecting film can have a constant reflectivity.

In addition, the shadow mask consistent with the present invention can be very accurately coupled to a substrate by fitting the downward protruding portion (i.e., the lower layer S2) of the shadow mask 200 into a concave portion (a cavity) of the substrate. That is, the shadow mask consistent with the present invention can be self aligned on a substrate.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A shadow mask comprising:
   an upper layer including a first opening formed through the upper layer in a thickness direction; and
   a lower layer formed on a lower surface of the upper layer around the first opening and including an opening having the same size as the first opening,
   wherein an outer width of the lower layer in a widthwise direction substantially perpendicular to the thickness direction is smaller than an outer width of the upper layer in the widthwise direction, and
   wherein the lower layer is a downward protruding portion of the shadow mask, and is disposed lower than an outer portion of the upper layer and configured to be inserted into a cavity of a substrate.

2. The shadow mask of claim 1, further comprising a middle layer interposed between the upper layer and the lower layer.

3. The shadow mask of claim 2, wherein the middle layer is a silicon oxide layer.

4. The shadow mask of claim 2, wherein an outer width of the middle layer in the widthwise direction is equal to the outer width of the lower layer.

5. The shadow mask of claim 2, wherein an inner width of the middle layer in the widthwise direction is equal to an inner width of the lower layer.

6. The shadow mask of claim 1, wherein the upper layer and the lower layer are silicon layers.

7. The shadow mask of claim 1, wherein the upper layer further comprises at least one second opening spaced apart from the first opening and the lower layer.

8. The shadow mask of claim 1, wherein the upper layer further comprises at least one second opening separated in the widthwise direction from the first opening of the upper layer, and disposed outwardly from an outer surface of the lower layer.

9. The shadow mask of claim 1, wherein the lower layer is configured to be aligned on side edges of the cavity.

10. The shadow mask of claim 1, wherein the lower layer is configured to contact a side wall of the cavity.

11. A method of forming a thin film, the method comprising:
    preparing a substrate having a cavity;
    aligning the shadow mask of claim 1 with the substrate so as to contact the lower layer of the shadow mask to a side wall of the cavity;
    forming a thin film on a portion of the substrate exposed by the first opening of the shadow mask; and
    removing the shadow mask.

12. The method of claim 11, wherein the lower layer has a thickness smaller than a depth of the cavity by 1 to 10 μm.

13. The method of claim 11, wherein the shadow mask comprises a second opening in the upper layer, and the thin film is also formed on a portion of the substrate exposed by the second opening.

14. A shadow mask comprising:
    an upper layer including a first opening formed through the upper layer in a thickness direction; and
    a lower layer formed on a lower surface of the upper layer around the first opening and including an opening having the same size as the first opening,
    wherein an outer width of the lower layer in a widthwise direction substantially perpendicular to the thickness direction is smaller than an outer width of the upper layer in the widthwise direction,
    wherein the upper layer and the lower layer are silicon layers.

* * * * *